United States Patent
Young et al.

(10) Patent No.: US 9,196,868 B2
(45) Date of Patent: Nov. 24, 2015

(54) ORGANIC LIGHT-EMITTING DEVICE WITH NANO-STRUCTURED LIGHT EXTRACTION LAYER AND METHOD OF MANUFACTURING THE SAME

(75) Inventors: Edward Willem Albert Young, Delft (NL); Chia-Chen Fan, Delft (NL)

(73) Assignee: Nederlandse Organisatie Voor Toegepast-Natuurwetenschappelijk Onderzoek TNO (NL)

(*) Notice: Subject to any disclaimer, the term of this patent is extended or adjusted under 35 U.S.C. 154(b) by 0 days.

(21) Appl. No.: 14/001,992

(22) PCT Filed: Feb. 28, 2012

(86) PCT No.: PCT/NL2012/050120
§ 371 (c)(1),
(2), (4) Date: Oct. 8, 2013

(87) PCT Pub. No.: WO2012/118375
PCT Pub. Date: Sep. 7, 2012

(65) Prior Publication Data
US 2014/0021450 A1    Jan. 23, 2014

(30) Foreign Application Priority Data
Mar. 1, 2011    (EP) .................................... 11156364

(51) Int. Cl.
*H01L 51/52*    (2006.01)
*H01L 51/56*    (2006.01)
(Continued)

(52) U.S. Cl.
CPC ............ *H01L 51/5262* (2013.01); *B82Y 20/00* (2013.01); *G02B 5/0242* (2013.01);
(Continued)

(58) Field of Classification Search
CPC . H01L 51/52; H01L 51/5262; H01L 51/5265; H01L 51/5278; H01L 51/5268; H01L 51/5275
USPC ................................................ 257/40; 438/29
See application file for complete search history.

(56) References Cited

U.S. PATENT DOCUMENTS 5,936,347 A * 8/1999 Isaka et al. ................... 313/509
6,217,984 B1 * 4/2001 Bruxvoort et al. ......... 428/195.1
(Continued)

FOREIGN PATENT DOCUMENTS

CN  101740610 A  6/2010
JP  2007258113  10/2007
(Continued)

OTHER PUBLICATIONS

Philips presentation: Assensment of OLED Light extraction structures by stimulation. Horst Greiner, Solid State Lighting Group, Philips Research Aachenm EL 2008, Bagni di Tivoli, Sep. 12.
(Continued)

*Primary Examiner* — Lex Malsawma
*Assistant Examiner* — J. R. Oakley
(74) *Attorney, Agent, or Firm* — Whyte Hirschboeck Dudek S.C.

(57) ABSTRACT

An organic light-emitting device is provided comprising a stack of layers including —an electro-optical layer structure (10) having a light emissive surface (12), —a light extraction structure (20) adjacent the light emissive surface, the light extraction structure has a nanostructured layer (22); and a backfill layer (24) comprising a material having a second index of refraction different from the first index of refraction, wherein the backfill layer (24) forms a planarizing layer over the nanostructured layer (22). The light emitting device includes a barrier film that comprises a first and a second inorganic layer (22, 26) and an organic layer (24) arranged between said inorganic layers. The one (22) of the inorganic layers of the barrier film closest to the electro-optical layer structure forms the nanostructured layer and the organic layer (24) between the inorganic layers forms the backfill layer.

7 Claims, 6 Drawing Sheets

(51) Int. Cl.
  *B82Y 20/00* (2011.01)
  *G02B 5/02* (2006.01)
  *H01L 51/00* (2006.01)

(52) U.S. Cl.
  CPC .......... *H01L51/003* (2013.01); *H01L 51/5206* (2013.01); *H01L 51/5256* (2013.01); *H01L 51/5275* (2013.01); *G02B 2207/101* (2013.01)

(56) References Cited

U.S. PATENT DOCUMENTS

| | | | |
|---|---|---|---|
| 2006/0063015 A1* | 3/2006 | McCormick et al. | 428/457 |
| 2009/0015142 A1* | 1/2009 | Potts et al. | 313/504 |
| 2010/0019664 A1* | 1/2010 | Mishima | 313/504 |
| 2010/0124044 A1* | 5/2010 | Kato | 362/97.1 |
| 2012/0038567 A1* | 2/2012 | Kim et al. | 345/173 |
| 2013/0146908 A1* | 6/2013 | Lin et al. | 257/98 |

FOREIGN PATENT DOCUMENTS

| | | |
|---|---|---|
| WO | 2008121414 | 10/2008 |
| WO | 2008139370 | 11/2008 |

OTHER PUBLICATIONS

Flexible Encapsulation Films & OLED Light Extraction Technology Plastic Electronics Europe Oct. 29, 2009, Dresden Germany, Thomas M Clausen.

61.2: Fluorescent White OLED Devices with Improved Light Extraction, Yuang-Sheng Tyan et al, SID 2008 Digest.

Efficiency enhancement of organic based Light Emitting Diodes using a scattering layer., R.F. Oulton and C.s. Adjiman, arXiv:physics/0411095 v1 Nov. 9, 2004.

Jeon, S., "Ultraviolet nanoimprinted polymer nanostructure for organic light emitting diode application", Applied Physics Letters 92, 223307 (2008).

* cited by examiner

FIG. 1A                    FIG. 1B

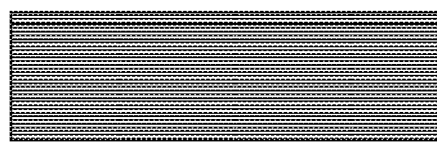
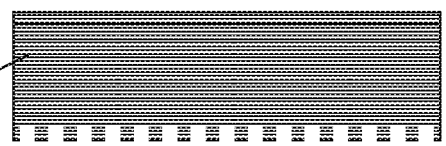
FIG. 2A  FIG 2B
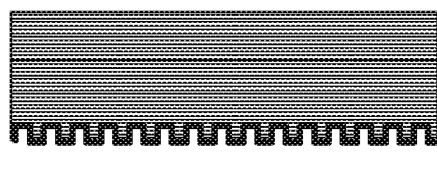
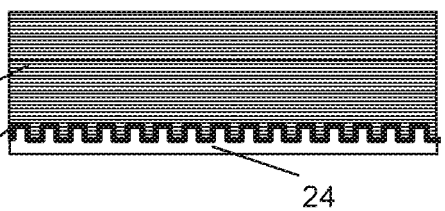
FIG 2C  FIG 2D
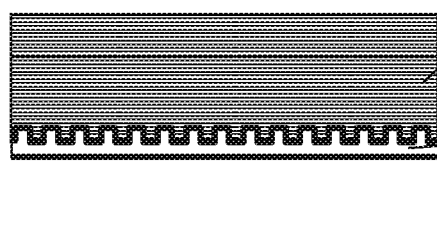
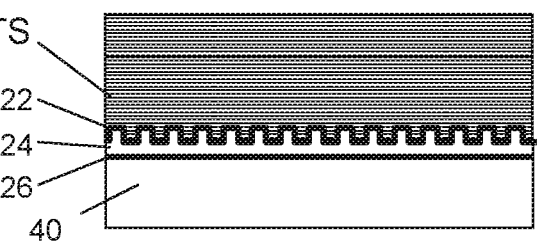
FIG 2E  FIG 2F

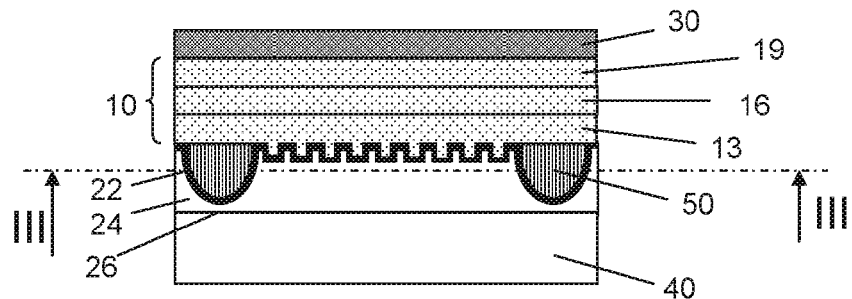
FIG. 3
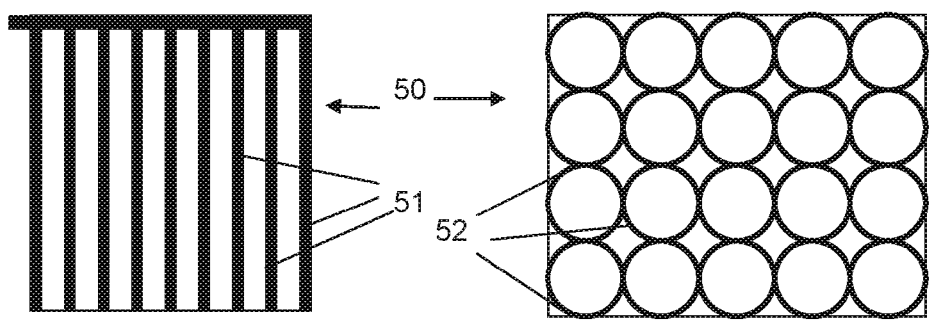
FIG. 3A
FIG. 3B
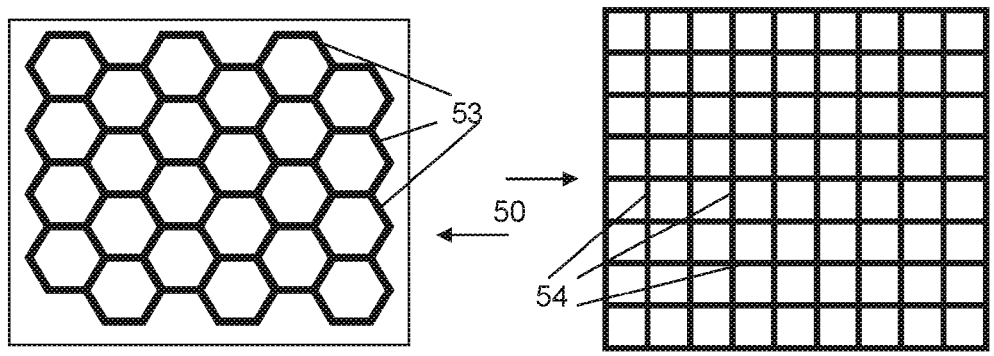
FIG. 3C
FIG. 3D

ORGANIC LIGHT-EMITTING DEVICE WITH NANO-STRUCTURED LIGHT EXTRACTION LAYER AND METHOD OF MANUFACTURING THE SAME

BACKGROUND

1. Field of the Invention

The present invention relates to a light-emitting device.

The present invention further relates to a method of manufacturing a light-emitting device.

2. Related Art

Organic Light Emitting Diodes (OLEDs) are the basis for a new display and lighting technology. OLED devices include a thin film of electroluminescent organic material sandwiched between a cathode and an anode, with at least one of these electrodes being a transparent conductor. When a voltage is applied across the device, electrons and holes are injected from their respective electrodes and recombine in the electroluminescent organic material through the intermediate formation of emissive excitons.

A bottom emitting OLED may be thought of as consisting of a core containing high index of refraction layers (organic layers for light generation, carrier transport, injection or blocking, and, typically, a transparent conductive oxide layer) and a low index of refraction substrate material, for example a glass plate or a polymer film. Therefore light that is generated within the core may encounter high index to low index interfaces where it might undergo internal reflection. Light unable to escape the core as a result of encounter at the first interface is confined to a waveguide mode, while light passing through that interface but unable to escape from the substrate as a result of reflection at the substrate-to-air interface is confined to a substrate mode. Similar optical losses occur due to interfaces in top emitting OLEDs.

In this way in OLED devices, over 70% of the generated light is typically lost due to processes in an evanescent zone close to the electroluminescent organic layer and the substrate air interface. The majority of the light undergoes internal reflections, which result in its being emitted from the edge of the device or trapped within the device and eventually being lost to absorption within the device after making repeated passes.

Solutions to improve the out-coupling of light at the substrate to air interface are quite common and rely on scattering or (micro) lenses at the substrate surface.

Solutions to improve the coupling of light from the OLED into the substrate are less common. Various solutions have been proposed to affect light reaching the substrate by disturbing that interface. In the evanescent zone, the exponentially decaying electromagnetic field in this zone is also known as evanescent field. Only part of the emitted light emerges through the transparent electrode as "useful" light into the substrate.

WO 2009011961 discloses a method for making an optical film for enhancing light extraction. The method comprises the steps of coating a layer of an organic material having a first index of refraction onto a flexible substrate;

imparting nanostructured features into the organic material to create a nanostructured surface; and applying a backfill layer to the nanostructured surface to form a planarizing layer on the nanostructured surface, wherein the backfill layer comprises a material having a second index of refraction different from the first index of refraction, and wherein a substantial portion of the nanostructured features are within an evanescent zone adjacent to a light emitting region of a self-emissive light source when the optical film is located against the self-emissive light source.

The optical film, so obtained is used to enhance light extraction in an OLED. The OLED comprises a self-emissive light source having at least one surface that outputs light from the device; and a light extraction film adjacent the at least one surface of the self-emissive light source, wherein the light extraction film comprises: a flexible substrate; a structured layer of extraction elements having a first index of refraction, wherein a substantial portion of the extraction elements are within an evanescent zone of the light output surface of the self-emissive light source; and a backfill layer comprising a material having a second index of refraction different from the first index of refraction, wherein the backfill layer forms a planarizing layer over the extraction elements, wherein the structured layer and backfill layer are in sufficient proximity to the light output surface of the self-emissive light source in order to at least partially enhance the extraction of light from that surface. In the device known from WO 2009011961 the backfill layer is arranged at a side of the structured layer that faces the OLED surface.

Necessarily with the optical film manufactured in this way the distance from the surface of the OLED to the interface between the structured layer and the backfill layer is still relatively large. In order to provide for a sufficient planarization the backfill layer should have a relatively high thickness.

WO 2009011961 remarks "When the backfill layer has a lower index than the structured layer, then the backfill layer preferably has a thickness substantially equal to the extraction elements. When the backfill layer has a higher index than the structured layer, then the backfill layer can be thicker than the extraction elements provided it can still interact with the evanescent wave. In either case, the structured layer and backfill layer are preferably in sufficient proximity to the light output surface in order to at least partially effect the extraction of light from that surface."

WO 2009011961 further notes that additional functionality could be incorporated into the light extraction film product by forming the extraction structures on an optional ultrabarrier film, which provides excellent moisture and oxygen barrier properties. Ultrabarrier films include multilayer films made, for example, by vacuum deposition of two inorganic dielectric materials sequentially in a multitude of layers on a glass or other suitable substrate, or alternating layers of inorganic materials and organic polymers, as described in U.S. Pat. Nos. 5,440,446; 5,877,895; and 6,010,751, all of which are incorporated herein by reference.

There is a need for further improvement of the extraction efficiency of OLED devices.

SUMMARY OF THE INVENTION

According to a first aspect of the present invention there is provided an organic light-emitting device according to claim 1.

In the organic light emitting device according to the first aspect, the first inorganic layer and the first organic layer perform a dual function. The first inorganic layer is a nanostructured layer facing the light emitting surface. The first organic layer forms a planarizing layer over the first inorganic layer. Therewith the interface between these layers has a nanopatterned structure that provides for an improved light extraction efficiency. Provided that the refractive index of the inorganic material of the first inorganic layer has a refractive index that differs by at least 0.1 from the refractive index of the organic layer the inorganic layer and the organic layer having the nanopatterned interface form a light extraction film. The best results are obtained when the first inorganic layer has refractive index higher than that of the organic layer. In practice inorganic materials have a relatively high refractive index in comparison to organic materials. Various combinations of an organic layer and an inorganic layer can be made wherein the inorganic material of the first inorganic layer has a refractive index that is at least 0.1 higher than the refractive index of the organic layer. By way of example inorganic layers, e.g. a vapor deposited layer of SiN, e.g. by PECVD, have a refractive index in the range of 1.6 to 1.8. Many organic materials have a refractive index in the range of 1.5 to 1.6.

Furthermore the first inorganic layer and the first organic layer cooperate with the second inorganic layer to form a barrier film.

The first inorganic layer may be nanostructured in that the first inorganic layer is provided with extraction elements for example in the form of cylinders, pyramids or cones. Nevertheless also other shapes are suitable. The extraction elements should have a size in the nanometer range. Preferably the extraction elements have a circumscribing circle in a plane defined by the first inorganic layer with a diameter D in the range of 40 to 200 nm. The extraction elements typically have a height H in the range of about 0.5 to 2 D, preferably approximately equal to I. A significantly higher value of the diameter or pitch, e.g. more 300 nm results in a less effective light extraction. A significantly lower value of the diameter, e.g. less than 30 nm requires that the first inorganic layer is relatively thin, as a result of which it no longer has a barrier function.

According to a second aspect of the present invention as claimed in claim 5 a very practical method is provided for manufacturing a light-emitting device according to the first aspect of the invention.

In the method according to the second aspect of the invention a temporary substrate is used that serves as a mould to form the nanostructure in the inorganic layer.

In an embodiment, the temporary substrate is a metal foil, e.g. of aluminum or copper. A main surface of the metal foil is provided with a nanopatterned relief. Various options are available to provide the nanopatterned relief. According to a first option the material of the foil is processed to obtain the desired structure, for example by embossing or by a patterned etching process. According to a second option a second material having said nanopatterned relief is provided. For example said second material may be deposited according to a nanopatterned relief. Alternatively the second material may be deposited as a homogeneous layer and subsequently be patterned, for example imprinting. Imprint methods comprise thermal imprint and (UV) curable resin print. In case of a thermal imprint a foil softened by heating is imprinted by pressing with a nano-stamp. In case of a (UV) curable resin print a resin layer is imprinted with a nano-stamp and directly cured, by (UV) treatment for example.

Subsequently a first inorganic layer is applied with a conformal deposition method after the temporary substrate is provided with a nanopatterned relief and the first organic layer is formed as a planarization layer over the conformally deposited first inorganic layer. Due to the conformal deposition thereof, the first inorganic layer that forms the nanostructured layer has a mutually conformal nanopatterned relief at both sides.

A second inorganic layer is subsequently deposited over the first inorganic layer. The first inorganic layer, the first organic layer and the second inorganic layer form a first barrier film. Due to the conformal deposition of the first inorganic layer a nanopatterned interface is formed between the first inorganic layer and the organic planarization layer.

At a side of the stack with the second inorganic layer a transparent substrate may be applied. The transparent substrate may be applied by a lamination step, e.g. using an intermediate adhesive layer. After application of the transparent substrate the temporary substrate is removed, e.g. by etching or solving the material of said substrate. Alternatively, the organic layer arranged between the first and the second inorganic layer may have a sufficient thickness, e.g. at least 25 μm to serve as a substrate for the device.

Subsequently an organic light emitting structure is applied at a side of said stack from which the temporary substrate was removed. The organic light emitting structure may be applied in a way known as such. Therewith the first inorganic layer that forms the nanostructured layer, and having a mutually conformal nanopatterned relief at both sides is the one of the inorganic layers of the barrier film closest to the electro-optical layer structure.

In an embodiment the nanostructured layer is irregularly patterned. This is advantageous is the electro-optical layer structure generates wide-band radiation. The irregular pattern prevents a color dependent behaviour of the structured layer.

In the electro-optical device according to the first aspect of the present invention the interface between the structured layer of extraction elements and the backfill layer can be close to the at least one surface of the self-emissive light source, therewith improving light extraction.

In the device according to the present invention the backfill layer can have a relatively large thickness without imparting the light outcoupling functionality of the interface between the structured layer and the backfill layer. The backfill layer can for example have a thickness in the range of 0.1-100 μm, preferably between 5 and 50 μm. If the thickness is sufficiently large, e.g. larger than 25 μm it may provide sufficient support to obviate a substrate.

In an embodiment of the device according to the first aspect of the invention a barrier layer is arranged between the structured layer and the backfill layer.

The barrier layer in practice has a relatively small thickness, i.e. in the order of in the range of 10 to 1000 nm, more preferably in the range of 100 to 300 nm and conformally covers the structured layer.

A barrier layer is defined herein as a layer forming a barrier for water vapor. I.e. the barrier layer should have a water vapour transmission rate (WVTR) of at most $10^{-4}$ g/m$^2$/day preferably $10^{-6}$ g/m$^2$/day or less.

The barrier layer typically is made of an inorganic material, which generally has a relatively high refractive index, while the structured layer and the backfill layer are typically made of an organic material, which has a relatively low refractive index.

In the method according to the present invention the step of releasing the temporary substrate from the nanostructured layer leaves a surface suitable for manufacturing the light-source. The light-source therewith is adjacent to the nanostructured layer, and the backfill layer can have an arbitrary thickness, and even be thick enough to serve as a substrate for the device.

BRIEF DESCRIPTION OF THE DRAWINGS

These and other aspects are described in more detail with reference to the drawing. Therein:

FIG. 1A shows a detail IA of the device according to FIG. 1, FIG. 1B shows a cross-section of the device of FIG. 1, according to view IB in FIG. 1A, FIG. 2A-2I show a first embodiment of a method according to the second aspect of the invention, FIG. 3 shows a second embodiment of an electro-optical device according to the first aspect of the invention, FIG. 3A to 3D shows details of variations of the second embodiment.

DETAILED DESCRIPTION OF EMBODIMENTS

Figure 1:
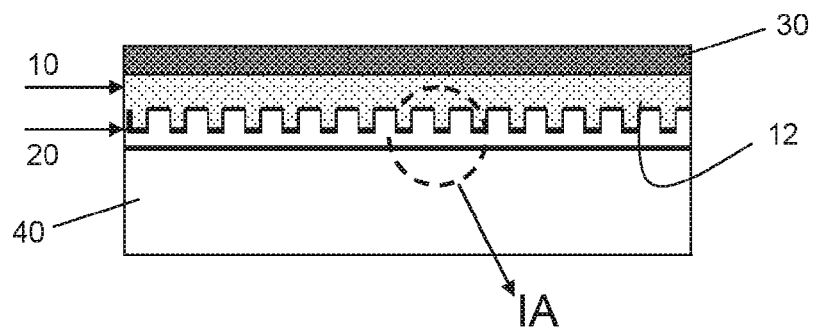
FIG. 1 shows a first embodiment of an electro-optical device according to the first aspect of the invention.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will further be understood that when a particular step of a method is referred to as subsequent to another step, it can directly follow said other step or one or more intermediate steps may be carried out before carrying out the particular step. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures.

It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1 shows a light-emitting device comprising an electro-optical layer structure 10 applied on a substrate 40 and having a light emissive surface 12. A light extraction film 20, of which a portion is shown in FIG. 1A, is arranged adjacent the light emissive surface 12 of the electro-optical layer structure 10.

As becomes apparent from FIG. 1A, the light extraction film 20 has a nanostructured layer 22 of extraction elements 23 having a first index of refraction, wherein a substantial portion of the extraction elements are within an evanescent zone of the light emissive surface of the electro-optical layer structure 10. The light extraction film has a backfill layer 24 comprising a material having a second index of refraction different from the first index of refraction, wherein the backfill layer 24 forms a planarizing layer over the extraction elements 23.

FIG. 1B shows a portion of the light extraction film 20 seen according to direction IB in FIG. 1A. In the example shown in FIG. 1B the extraction elements 23 are formed as cylindrical pits in the inorganic layer. In the example shown the cylindrical pits have a diameter D of about 150 nm and are arranged at an average distance of about 300 nm. The pits forming the extraction elements 23 have a height H of about 150 nm. In the embodiment shown the extraction elements are randomly distributed. This is advantageous in the case that the electro-optical layer structure 10 generates radiation in a relatively broad wavelength range. In this way the effect of the light extraction film 20 is substantially wavelength independent. Alternatively, or in addition the size or shape of the extraction elements 23 may vary randomly.

Alternatively the extraction elements 23 may be regularly sized and shaped and be applied according to a regular pattern such as ribbons, for example in case the electro-optical layer structure 10 generates light in a small wavelength range.

The light emitting device shown in FIGS. 1, 1A and 1B includes a barrier film that comprises a first and a second inorganic layer 22, 26 and an organic layer 24 arranged between said inorganic layers. The one of the inorganic layers 22 of the barrier film closest to the electro-optical layer structure 10 forms the structured layer of extraction elements and the organic layer 24 between the inorganic layers 22, 26 forms the backfill layer.

In the embodiment shown the first and the second inorganic layer 22, 26 each are a silicon nitride layer obtained by a CVD process, e.g. a PECVD process. Other transparent ceramic materials such as silicon oxide (SiO2), aluminum oxide (Al2O3), titanium oxide (TiO2), silicon carbide (SiC), and silicon oxynitride (SiON) are also suitable. The inorganic layers each have a thickness in the range of 10 to 1000 nm, preferably in the range of 50 to 300 nm. In this case the inorganic layers 22, 26 have a thickness of 50 nm. In the present case the organic layer 24 is a layer of acrylate polymer applied by spin coating. Examples of acrylate polymers having a relatively low refractive index are included in the following table.

| Name | n |
|---|---|
| Poly(1,1,1,3,3,3-hexafluoroisopropyl acrylate) | 1.375 |
| Poly(2,2,3,3,4,4,4-heptafluorobutyl acrylate) | 1.377 |
| Poly(2,2,3,3,4,4,4-heptafluorobutyl methacrylate) | 1.383 |
| Poly(2,2,3,3,3-pentafluoropropyl acrylate) | 1.389 |
| Poly(1,1,1,3,3,3-hexafluoroisopropyl methacrylate) | 1.39 |
| Poly(2,2,3,4,4,4-hexafluorobutyl acrylate) | 1.394 |
| Poly(2,2,3,3,3-pentafluoropropyl methacrylate) | 1.395 |
| Poly(2,2,2-trifluoroethyl acrylate) | 1.411 |
| Poly(2,2,3,3-tetrafluoropropyl acrylate) | 1.415 |
| Poly(2,2,3,3-tetrafluoropropyl methacrylate) | 1.417 |
| Poly(2,2,2-trifluoroethyl methacrylate) | 1.418 |

The organic layer 24 should have a thickness of at least about two times the depth of the pits in the first inorganic layer. Typically the thickness of the organic layer 24 is in the range of 0.1-100 μm, preferably between 5 and 50 μm. In the present embodiment the thickness is 20 μm.

In the embodiment shown the light-emitting device has a further barrierfilm 30 at a side of the electro-optical layer structure 10 opposite the barrier film formed by layers 22, 24, and 26. For clarity the further barrierfilm 30 is shown as a single layer. Several options are possible. In an embodiment the further barrierfilm 30 may be formed by a glass or metal layer. In another embodiment the further barrierfilm 30 may be formed by a stack of inorganic layers having a mutually different composition, for example a stack of silicon nitride and silicon oxide layers alternating each other. In again another embodiment the further barrier film 30 may comprise a stack of an inorganic layer, an organic layer and an inorganic layer. Also combinations of these options may be used.

Figure 1C:
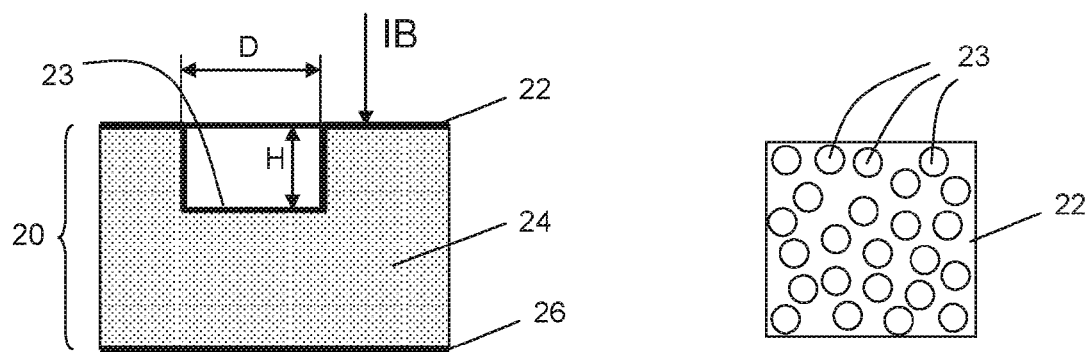
FIG. 1C shows a part of the device in more detail.
Figure 1C:
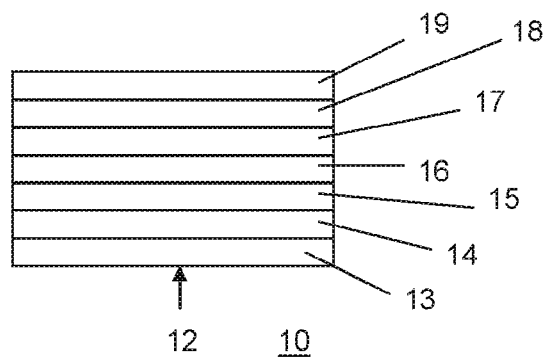

FIG. 1C schematically shows the electro-optical layer structure 10 having the light emissive surface 12. The electro-optical layer structure 10 further comprises a first and a second electrode 13, 19 and at least one electro-optical layer 16. Presuming that the first electrode 13 is a transparent anode, the electro-optical layer structure can subsequently comprises the anode 13, a hole injection layer 14, a hole transport layer 15, the electro-optical layer 16, an electron transport layer 17, an electron injection layer 18 and the cathode 19. In that case the light emitting surface 12 is at the side of the stack formed by the anode 13. Alternatively the electro-optical layer structure 10 may have its light emitting surface at a side formed by the cathode 19. Not all layers described with reference to FIG. 1C need to be present. It is sufficient if the electro-optical layer structure 10 comprises a first and a second electrode 13, 19 and at least one electro-optical layer 16. However, the efficiency of the device can be improved by the presence of one or more of the additional layers 14, 15, 17, 18.

FIG. 2A-2K illustrate an embodiment of a method according to the second aspect of the invention with which the light-emitting device of FIG. 1 can be manufactured.

FIG. 2A illustrates a first step, wherein a temporary substrate TS is provided. Typically the temporary substrate TS is a polymer foil. The foil preferably has a thickness of at least 0.010 to 0.2 mm. A foil of a substantially smaller thickness, e.g. smaller than 0.005 mm is too fragile for a typical manufacturing process. At a substantially larger thickness, e.g. larger than 1 mm, the foil becomes relatively inflexible which complicates its handling when guiding it through a roll to roll system. For other manufacturing techniques a larger thickness could be used.

Figure 2B:
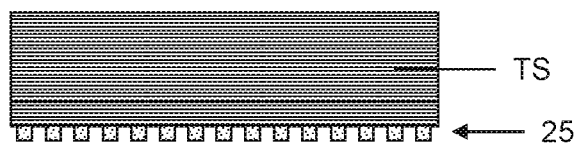

Subsequently a nanostructured layer 22 of a first material having a first refractive index is applied at a surface of the temporary substrate TS. In the embodiment shown this is realized in that first a nanopatterned relief is formed in the temporary substrate as shown in FIG. 2B and in that the first material is deposited on the surface of the temporary substrate having the nanopatterned relief as shown in FIG. 2C.

In the present embodiment the nanopatterned relief in the temporary substrate TS is obtained by imprinting the temporary substrate TS. Subsequently the first material, here silicon nitride is deposited by a vapor deposition method. The silicon nitride layer has a refractive index n in the range of 1.6<n<1.8. The inorganic layers of the barrier structure may be applied by all kinds of physical vapour deposition methods such as thermal evaporation, e-beam evaporation, sputtering, magnetron sputtering, reactive sputtering, reactive evaporation, etc. and all kinds of chemical vapour deposition methods such as thermal chemical vapour deposition (CVD), photo assisted chemical vapour deposition (PACVD), plasma enhanced chemical vapour deposition (PECVD), etc. Also atomic layer deposition ALD is very suitable for depositing for conformal deposition of the inorganic layer. As a result of the conformal deposition method, a nanostructured layer 22 is obtained that has a mutually conformal nanopatterned relief at both sides.

FIG. 2D shows how the backfill layer 24 of a second material is deposited on the nanostructured layer 22 of the first material. The second material has a refractive index of about 1.6, i.e. differing by at least 0.1 from the refractive index of the first material.

The first organic layer 24 of the barrier structure 20 forming the backfill layer may be applied by all kinds of coatings techniques, such spin coating, slot-die coating, kiss-coating, hot-melt coating, spray coating, etc. and all kinds of printing techniques, such as inkjet printing, gravure printing, flexographic printing, screen printing, rotary screen printing, etc.

As shown in FIG. 2E a further layer 26 of an inorganic material is deposited on the backfill layer 24. The nanostructured layer 22, the backfill layer 24 and the further layer 26 form a barrier film.

FIG. 2F shows how the stack of layers 22, 24, 26 obtained in the previous steps is laminated with a further substrate 40. The further substrate 40 should be of a transparent material, such as glass or a polymer.

Figure 2G:
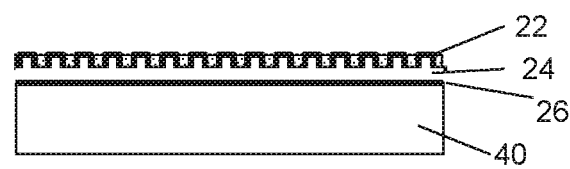
Figure 2G:
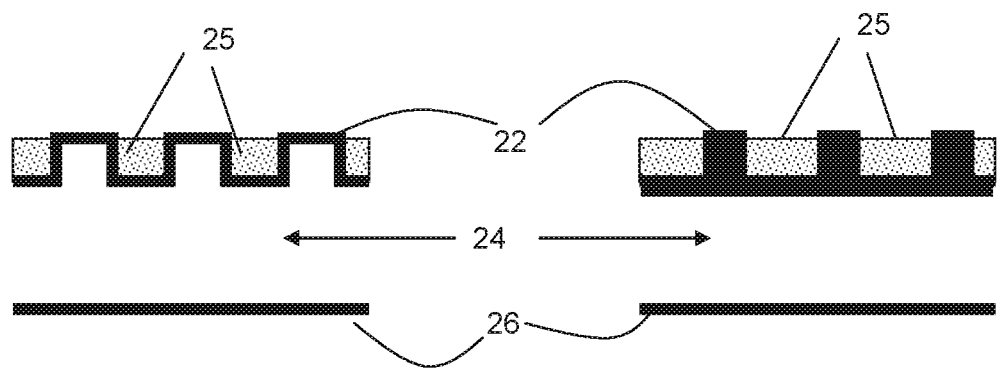

After the stack of layers is laminated with the further substrate 40 the temporary substrate TS is removed from the stack, as is shown in FIG. 2G. A temporary substrate TS formed by metal foil may for example be removed by an etching agent. The temporary substrate therewith releases a surface of the nanostructured layer that is used for further processing. By way of example a copper substrate may be removed with etchants like FeCl3, nitric acid or sulphuric acid. As another example an aluminium substrate may be etched by NaOH, KOH and mixtures of phosphoric acid and nitric acid.

Figures 2G, 2H:
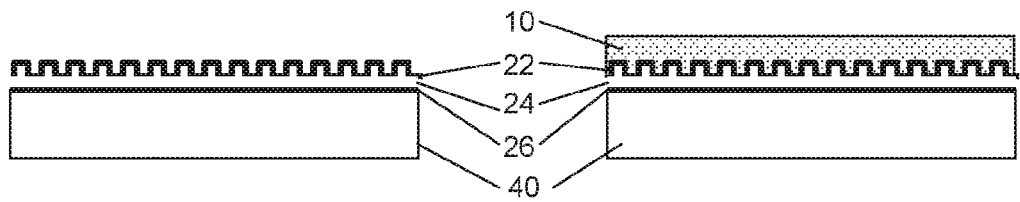

In a next step shown in FIG. 2H an electro-optical layer structure 10 is deposited at the surface of the nanostructured layer 22 that was released by the temporary substrate TS. The electro-optical layer structure 10 has a light emissive surface facing the released surface of the nanostructured layer 22. Therewith the one 22 of the inorganic layers of the barrier film closest to the electro-optical layer structure 10, forming the nanostructured layer has a mutually conformal nanopatterned relief at both sides.

Figure 2I:
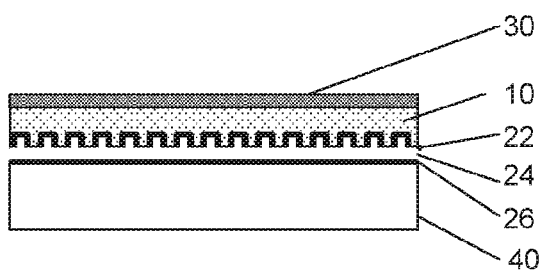

Subsequently in a step shown in FIG. 2I a further barrier film 30 is applied at a side of the electro-optical layer structure 10 opposite the barrier film formed by layers 22, 24, 26.

Figures 2J, 2K:
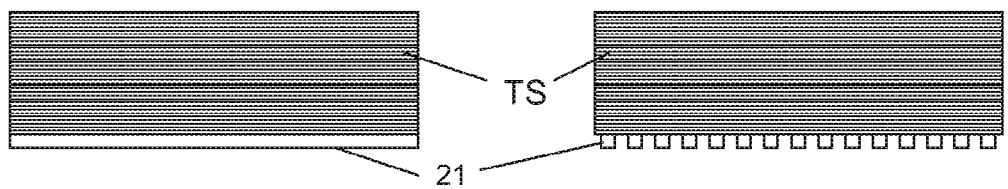
FIGS. 2J and 2K shows steps of a second embodiment of a method according to the second aspect of the invention, FIG. 2BA shows an alternative for the step shown in FIG. 2B FIG. 2GA shows an alternative for the step shown in FIG. 2G, FIG. 2GB shows this step in more detail, FIG. 2GC shows an alternative.

As an alternative to the step described with reference to FIG. 2B the temporary substrate TS may alternatively be provided with a nanopatterned relief as shown in FIGS. 2J and 2K. According to FIG. 2J the temporary substrate TS is provided with an organic layer 21 at a main surface, and subsequently the nanopatterned relief is imprinted in the organic layer as shown in FIG. 2K. Subsequently the step shown in FIG. 2K may be followed by the steps described above with reference to FIG. 2C to 2I. Various other options are available to provide the temporary substrate TS with the nanopatterned relief. For example the nanopatterned relief may be applied to the main surface of the temporary substrate by standard lithographic steps, including applying a photoresist layer at the main surface. Patterning the photo resist layer by applying a nanostructured radiation pattern corresponding to the desired relief, developing the photoresist layer, etching exposed parts of the temporary substrate TS, and removing the remaining photo-resist layer. Subsequently the steps described above with reference to FIG. 2C to 2I may be applied. In again another variant the temporary substrate TS is provided with the nanopatterned relief by printing a layer 25 of an auxiliary material according to the desired nanopattern in the relief onto the main surface as shown in FIG. 2BA. Alternatively a layer 25 of an auxiliary material with a nano-patterned relief onto the temporary substrate TS may be obtained by depositing the layer 25 as a homogeneous layer and subsequently imprinting the layer 25. Subsequently the steps described above with reference to FIG. 2C to 2I may be applied.

The auxiliary material may be transparent, e.g. a transparent polymer. In an embodiment of the method according to the second method only the temporary substrate TS is removed, so that the auxiliary material of the layer 25 remains within the nanostructured layer 22 as is shown in FIG. 2GA, and in more detail in FIG. 2GB. In an alternative embodiment of the method according to the second aspect as illustrated in FIG. 2GC, the nanostructured layer 22 completely planarizes the relief in the auxiliary material 25.

FIG. 3 shows an alternative embodiment of an organic light-emitting device according to the first aspect. Parts therein corresponding to those of FIGS. 1, 1A and 1B have the same reference numerals. In addition to the embodiment shown in FIGS. 1, 1A and 1B the organic light-emitting device comprises an electrically conductive structure 50 that extends between the backfill layer 24 and the electro-optical structure 10. The electrically conductive structure 50 is electrically connected to an electrode 13 of the electro-optical structure 10. In particular the electrically conductive structure 50 is applied against the electrode 13. The electrically conductive structure may have a thickness in the range of 0.3 μm to 30 μm, and a width in the range of a few μm to about 1 mm.

The electrically conductive structure 50 is arranged between the first inorganic layer 22 and the electro-optical structure 10.

FIG. 3A is a cross-section according to III-III in FIG. 3 wherein the electrically conductive structure 50 is shown. For clarity other elements of the organic light-emitting device are not shown. As becomes apparent from FIG. 3A, the electrically conductive structure 50 has elongate elements 51 that extend in a plane defined by the electrically conductive structure. In the embodiment illustrated in FIG. 3A the elongate elements 51 are formed as straight lines that extend over the full width or length of the organic light-emitting device.

Other embodiments are shown of the electrically conductive structure 50 according to the same cross-section III-III.

FIG. 3B shows an alternative embodiment, wherein the elongate elements 52 are formed as mutually connected circles that form a mazelike structure.

FIG. 3C shows another alternative embodiment, wherein the elongate elements 53 are arranged to form a hexagonal maze. In the embodiment of FIG. 3D the elongate elements 54 form a rectangular maze.

FIG. 4A to 4D shows a method of manufacturing an organic light-emitting device according to the embodiment shown in FIG. 3.

Figure 4A:
FIG. 4A to 4D illustrate steps of a third embodiment of a method according to the second aspect of the invention, suitable for manufacturing the electro-optical device according of FIG. 3.
Figure 4B:

As shown in FIG. 4A in a first step a temporary substrate TS is provided. This step corresponds to the first step illustrated with reference to FIG. 2A. In a next step a nanopatterned relief 21 is applied at a main surface of the temporary substrate TS. In this case the nanopatterned relief 21 is formed by imprinting the main surface of the temporary substrate TS according to the nanopattern. Instead of imprinting the main surface of the temporary substrate TS, it is possible to imprint a pattern into a wet layer that is deposited on the substrate just prior to the imprint and that is cured after the process of imprinting. For example a wet layer of a photopolymer may be cured by UV-radiation or a wet layer of a thermally hardening polymer may be thermally cured. For the imprint, a hard template plate is used as a stamp. This template can for instance be made out of Nickel.

However, as described with reference to FIG. 2B before, various other options are possible to obtain the nanopatterned relief.

Figure 4C:
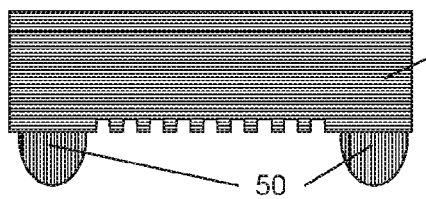

As shown in FIG. 4C an electrically conductive structure 50 is subsequently applied. If desired the steps show in FIGS. 4B and 4C may be exchanged.

Subsequently, an organic light-emitting device as show in FIG. 3 may be obtained by continuing with the steps described with reference to FIG. 2C-2I.

Figure 4D:
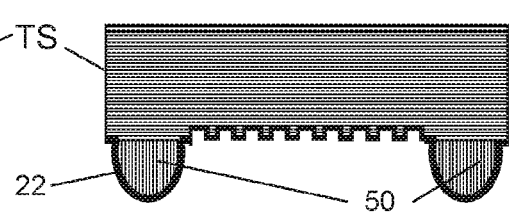

By way of example FIG. 4D shows the step equivalent to step described with reference to FIG. 2C.

Figure 5:
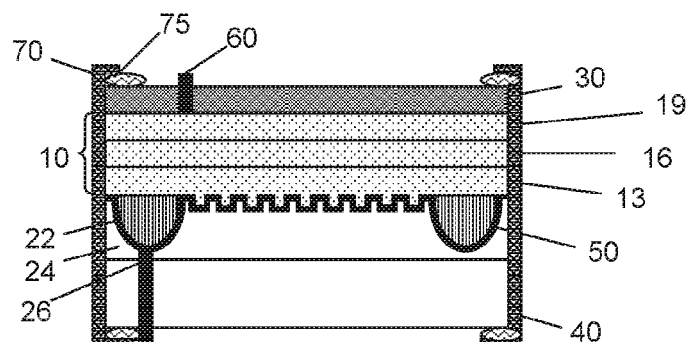
FIG. 5 shows a third embodiment of an electro-optical device according to the first aspect of the invention.
Figure 6:
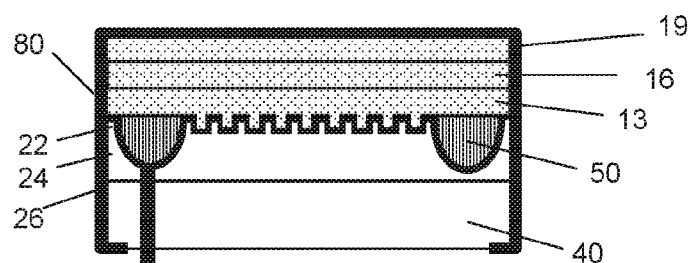
FIG. 6 shows a fourth embodiment of an electro-optical device according to the first aspect of the invention.

In a subsequent step the device may for example be provided with a sealing and with electrical connectors to the electrodes as shown in more detail in FIG. 5 and FIG. 6.

In FIG. 5 the side-faces of the electro-optical device are sealed by flexible edge-seals 70 that are attached to the side faces of the device using a sealant 75. The flexible edge-seals 70 may be formed of a metal foil, e.g. a copper or an aluminium foil. Possible sealants 75 comprise epoxies, acrylates, Norland 68 UV curables, thermally curable adhesives, pressure sensitive adhesives, such as thermosets and thermoplasts or room temperature vulcanized (RTV) adhesives, for instance. The sealant 75 generally comprises any material having a low permeability and providing adhesion. A first external contact 60 may be applied via the further barrier layer 30 to the electrode 19. A second external contact 65 may be connected to the electrically conductive structure 50. An intermediate conductor for the first electrical contact 60 is formed for example by drilling a hole, preferably by laser drilling, in the further barrier layer 30 and filling the hole with a conductive adhesive. In an analogous manner the electrical connections may be made for the second electrical contact 65.

In the embodiment shown in FIG. 6 the electro-optical device is wrapped into a metal foil 80, that both serves as a barrier layer and as an electric conductor to the electrode 19.

In the claims the word "comprising" does not exclude other elements or steps, and the indefinite article "a" or "an" does not exclude a plurality. A single component or other unit may fulfil the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. Method for manufacturing an organic light-emitting device, said method comprising the steps of forming a stack of layers by
    providing a temporary substrate (TS) having a main surface,
    providing a nanopatterned structure at said main surface,
    applying with a conformal deposition method a layer (22) of a first inorganic material at said main surface of the temporary substrate having the nanopatterned relief,
    applying a first organic layer (24) over said conformally deposited first inorganic layer (22),
    applying a second inorganic layer (26) over said first organic layer (24),
    removing the temporary substrate (TS) to form a released surface of the nanolayer structure (22), and
    applying an electro-optical layer structure (10) on the released surface of the nanolayer structure (22).

2. Method according to claim 1, wherein the nanopatterned relief is applied by application of an auxiliary organic material at said surface of the temporary substrate with a patterned deposition process.

3. Method according to claim 2, wherein the patterned deposition process is a printing process.

4. Method according to claim 3, wherein the patterned deposition process is a vapor deposition process.

5. Method according to claim 1, wherein the nanopatterned relief at the main surface of the temporary substrate is formed by imprinting the main surface of the temporary substrate.

6. Method according to claim 1, wherein the nanopatterned relief at the main surface of the temporary substrate is formed by depositing an additional organic layer at the main surface of the temporary substrate and imprinting the nanopatterned relief in the additional organic layer.

7. Method according to claim 1, further comprising the step of depositing an electrically conductive structure having elongate elements at said main surface of the temporary substrate before depositing the layer of a first inorganic material.

* * * * *